(12) United States Patent
Sakaida et al.

(10) Patent No.: US 7,418,901 B2
(45) Date of Patent: Sep. 2, 2008

(54) SCREEN PRINTING METHOD AND APPARATUS THEREOF

(75) Inventors: Atusi Sakaida, Nagoya (JP); Toshihisa Taniguchi, Handa (JP); Norio Goko, Kariya (JP)

(73) Assignee: DENSO CORPORATION, Kariya (JP)

( * ) Notice: Subject to any disclaimer, the term of this patent is extended or adjusted under 35 U.S.C. 154(b) by 193 days.

(21) Appl. No.: 11/311,180

(22) Filed: Dec. 20, 2005

(65) Prior Publication Data

US 2006/0144264 A1    Jul. 6, 2006

(30) Foreign Application Priority Data

Jan. 5, 2005    (JP)    ............... 2005-000573

(51) Int. Cl.
*B41M 1/12*    (2006.01)
*B05C 17/04*    (2006.01)

(52) U.S. Cl. ............... 101/129; 101/123; 101/126; 101/485

(58) Field of Classification Search ............... 101/114, 101/115, 116, 123, 124, 126, 129, 485, 486
See application file for complete search history.

(56) References Cited

U.S. PATENT DOCUMENTS 4,610,200 A * 9/1986 Metso ............... 101/126
5,176,078 A * 1/1993 Homma et al. ............... 101/126
6,131,511 A * 10/2000 Wachi et al. ............... 101/129

FOREIGN PATENT DOCUMENTS

| JP | A-H06-155706 | 6/1994 |
| JP | A-H09-11437 | 1/1997 |
| JP | A-H11-986 | 1/1999 |
| JP | A-H11-48445 | 2/1999 |
| JP | A-2002-248732 | 9/2002 |

* cited by examiner

*Primary Examiner*—Ren Yan
(74) *Attorney, Agent, or Firm*—Posz Law Group, PLC

(57) ABSTRACT

A dummy work (DW: a work for printing a reference necessary for subsequent printing) is moved to a printing position while the dummy work is fixed to a work alignment mechanism 2, and solder printing is made. The printed dummy work is then returned to the work alignment position and its image is taken by image processing cameras 7 and an image of position coordinates of a solder bump specified for alignment is stored. Positioning of subsequent works W is conducted on the basis of the image of the dummy work stored and solder printing of the works is subsequently made at the printing position.

2 Claims, 5 Drawing Sheets

WORK ALIGNMENT POSITION

SOLDER PRINTING POSITION

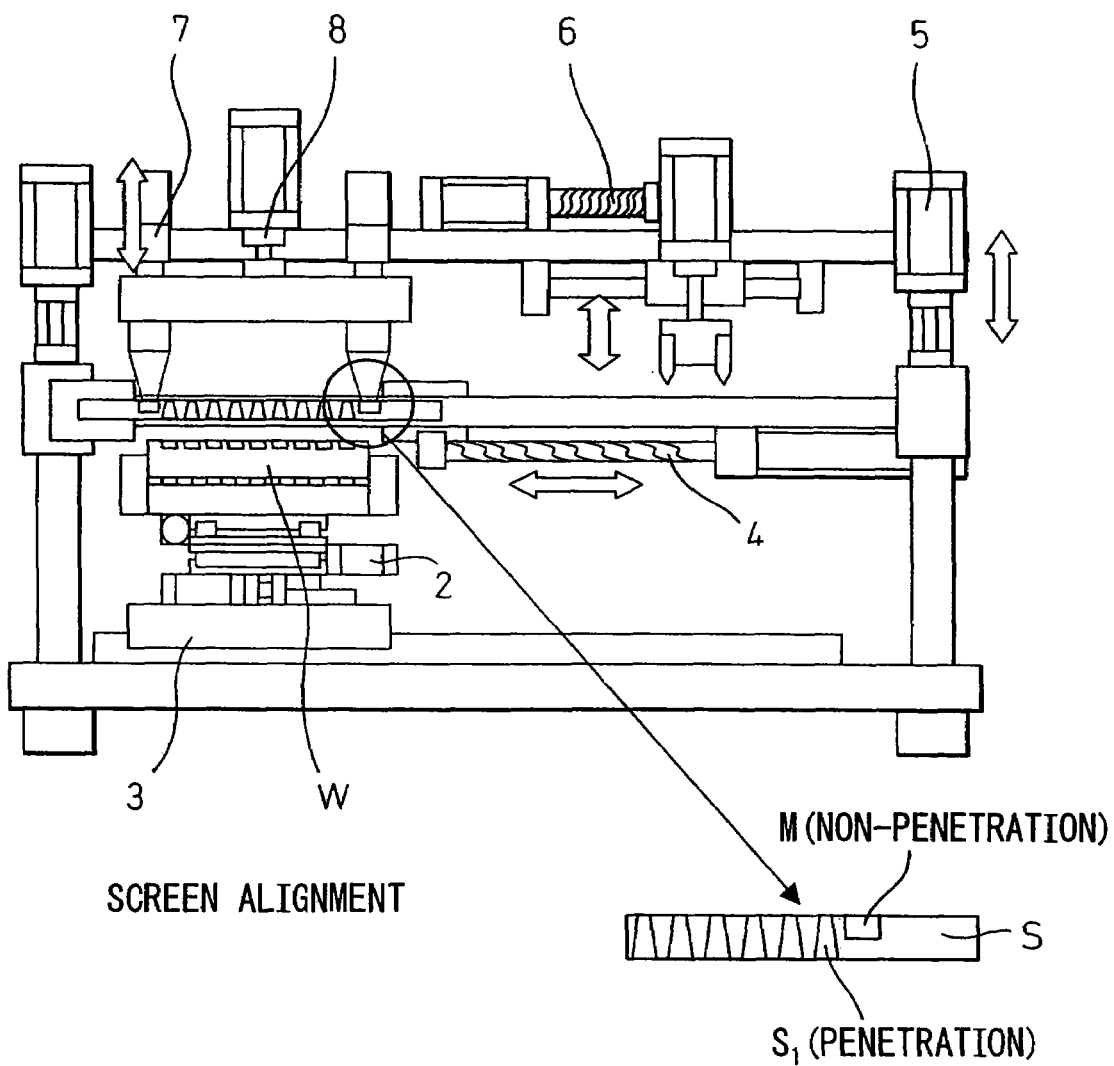

SCREEN PRINTING METHOD AND APPARATUS THEREOF

BACKGROUND OF THE INVENTION

1. Field of the Invention

This invention relates to a screen printing method for printing solder paste, etc., onto a work through a screen mask, and a printing apparatus. More particularly, the invention relates to a screen printing method, and an apparatus for the method, that will be suitable for providing screen printing on a high density multi-layered substrate, and a printing apparatus.

2. Description of the Related Art

To connect a printed substrate and a semiconductor chip, a connection system called a "flip-chip (FC) system", that uses solder bumps (minute solder protrusions), has generally been used. This system can connect, at one time, thousands or dozens of thousands of connection points by arranging semiconductor bumps in a plane. With the progress of IT technologies, semiconductor chips have higher functions and the connection of such semiconductor chips requires a more minute size, a higher density and a greater number of connection points.

To form the solder bumps, a prior art method uses an apparatus executing two steps at a work alignment position and a solder printing position, sets a work (substrate) to the work alignment position, moves the work to the solder printing position, then superposes a metal screen mask (hereinafter called "screen") on the work by using a screen elevation mechanism and prints the solder paste to the work for printing through a squeegee, or the like (refer to Japanese Unexamined Patent Publication No. 6-155706, for example).

FIGS. 4 and 5 of the accompanying drawings show this screen printing apparatus according to the prior art. The screen printing machine 1 includes a work alignment mechanism 2 for positioning a work (substrate) W, a work movement mechanism 3 for causing the work W to linearly reciprocate between a work alignment position and a solder printing position, a screen movement mechanism 4 for causing a screen S to linearly reciprocate between the work alignment position and the solder printing machine, a screen elevation mechanism 5 for moving the screen S up and down, a solder bump printing mechanism 6, an image processing camera 7, a camera elevation mechanism 8, and so forth. In this printing apparatus 1, the work W is put on a table 21 of the work alignment mechanism 2 and is positioned by the work alignment mechanism 2 at the work alignment position on the basis of the image taken by the image processing camera 7. Next, the work W is moved to the solder printing position by the work movement mechanism 3 and the screen S is superposed on the work at this solder printing position by the screen movement mechanism 4 and the screen elevation mechanism 5. A squeegee 61 of the solder bump printing mechanism 6 is moved and the solder paste P is applied to the work W through the screen S to thereby print the solder bumps B onto the work W.

Generally, a decisive factor in the printing quality of the solder bumps is the precision of superposition of the printing pattern of the screen S onto the screen pattern of the work W. Because an opaque metal screen S is used, it is not possible to superpose the work W and the screen S one upon another and then to position them. Therefore, a system that individually aligns a positioning marker M of the metal screen S and a positioning marker of the work W by using an image processor and mechanically superposes the screen S and the work W one upon another on the basis of the image processing data has been employed.

When the image processing camera 7 is stationary as shown in FIGS. 4 and 5, therefore, the system becomes the printing system that moves the screen S to the work alignment position by using the screen movement mechanism, aligns the screen S by using the image processing camera 7 and then returns the screen to the solder printing position to conduct printing. Therefore, the number of moving mechanisms, such as those for the movement and elevation of the screen S and for the elevation of the image processing camera 7, is large and the set position of the screen S after positioning contains mechanical errors, from the individual movement mechanisms, during alignment.

In addition, because the positioning marker (non-penetrating due to half etching) disposed in the screen S and a printing port (penetrating) for practically soldering the solder have different processing conditions, processing is not simultaneous processing and processing errors occur. This error is further increased by a camera movement system.

Therefore, it has become difficult, in recent years, for such a solder printing mechanism of the prior art and including complicated mechanisms, to satisfy the requirements for further miniaturization, higher density and a greater number of connection points owing to the structural errors.

In a high density multi-layered substrate of the next generation, in particular, the number of bumps per work is thousands of bumps and is more than ten times the number of the existing bumps that is in the order of hundreds. Therefore, the bump density also reaches a high density of bump diameter φ100×pitch 150 µm. The solder paste printing method of the prior art alignment system cannot easily cope with such a requirement.

Further, according to the PALAP (Patterned prepreg Lay-up Process) substrate filed by the present applicant, the substrate material has high wettability with solder unlike the conventional glass-epoxy substrates. Unless the solder is correctly transferred to the bump formation positions, the solder flows during re-flow (because the solder is molten in a non-oxidizing atmosphere to form balls through surface tension) and connects adjacent bumps to cause a bridge defect. Therefore, a printing technology not inviting oozing of the solder, resulting from floating of the screen, is necessary.

SUMMARY OF THE INVENTION

The invention is completed in view of the problems described above and aims at providing a screen printing method, and an apparatus for the method, capable of correctly conducting solder bump printing on a high density multi-layered substrate of the next generation by the reducing errors to only a work positioning error whereas two mechanical errors have occurred, due to the camera movement, in the prior art system that individually image-processes data of the screen and of the work.

According to one aspect of the invention, there is provided a screen printing method that includes the steps of moving a dummy work DM (a work to which a reference necessary for subsequent printing is printed will be hereinafter called "dummy work SW") to a printing position while the dummy work DW is fixed to a work alignment mechanism 2, conducting solder printing to the dummy work, returning the dummy work DW after solder printing to the work alignment position, taking the image of the dummy work DW by an image processing camera 7, storing the image of position coordinates of a solder bump specified for alignment from the image of the solder-printed dummy work, and conducting positioning of subsequent works on the basis of the image of the dummy work DM so stored. Accordingly, it becomes possible to reduce mechanical errors resulting from the movement of the individual mechanisms, to conduct highly precise positioning and to conduct solder bump printing on a high density multi-layered substrate.

In the screen printing method according to the invention, positioning of the work is repeatedly made on the basis of the stored position coordinates of the dummy work DW, and the center coordinates of the image data of the work W individually taken are processed statistically to minimize the repetition errors. In this way, the precision of positioning can be further improved.

According to another aspect of the invention, there is provided a screen printing apparatus comprising a work alignment mechanism 2 for putting thereon a work and conducting positioning of the work on the basis of information from a control unit 9; a work movement mechanism 3 for moving the work alignment mechanism 2 between a work alignment position and a printing position; a screen elevation mechanism 5 for moving up and down a screen mask S fixed at the printing position; a printing mechanism 6 for printing solder paste P to the work W through the screen mask S; and an image processing camera 7 fixed at the alignment position; the control unit 9 storing an image of a solder bump specified for alignment from the image of the image processing camera 7 and controlling the work alignment mechanism 2 on the basis of the image so stored; wherein positioning of subsequent works is made on the basis of an image of the dummy work DW first printed or the work printed immediately before or a statistic mean value of printed works repeatedly printed that provides the highest positioning result. Accordingly, the same function and effect as that of claim 1 can be acquired. The construction can be simplified because a screen movement mechanism, a camera elevation mechanism, etc., can be eliminated.

In the screen printing apparatus according to the invention, the work and the screen mask are a work and a screen that do not have a positioning marker, respectively. Accordingly, the occurrence of processing errors resulting from different processing conditions of a penetration hole and a non-penetration hole can be prevented.

The present invention may be more fully understood from the description of preferred embodiments of the invention, as set forth below, together with the accompanying drawings.

BRIEF DESCRIPTION OF THE DRAWINGS

In the drawings:

FIG. 5 is an explanatory view for explaining alignment of a metal screen of the screen printing apparatus according to the prior art.

DESCRIPTION OF THE PREFERRED EMBODIMENTS

Figure 1:
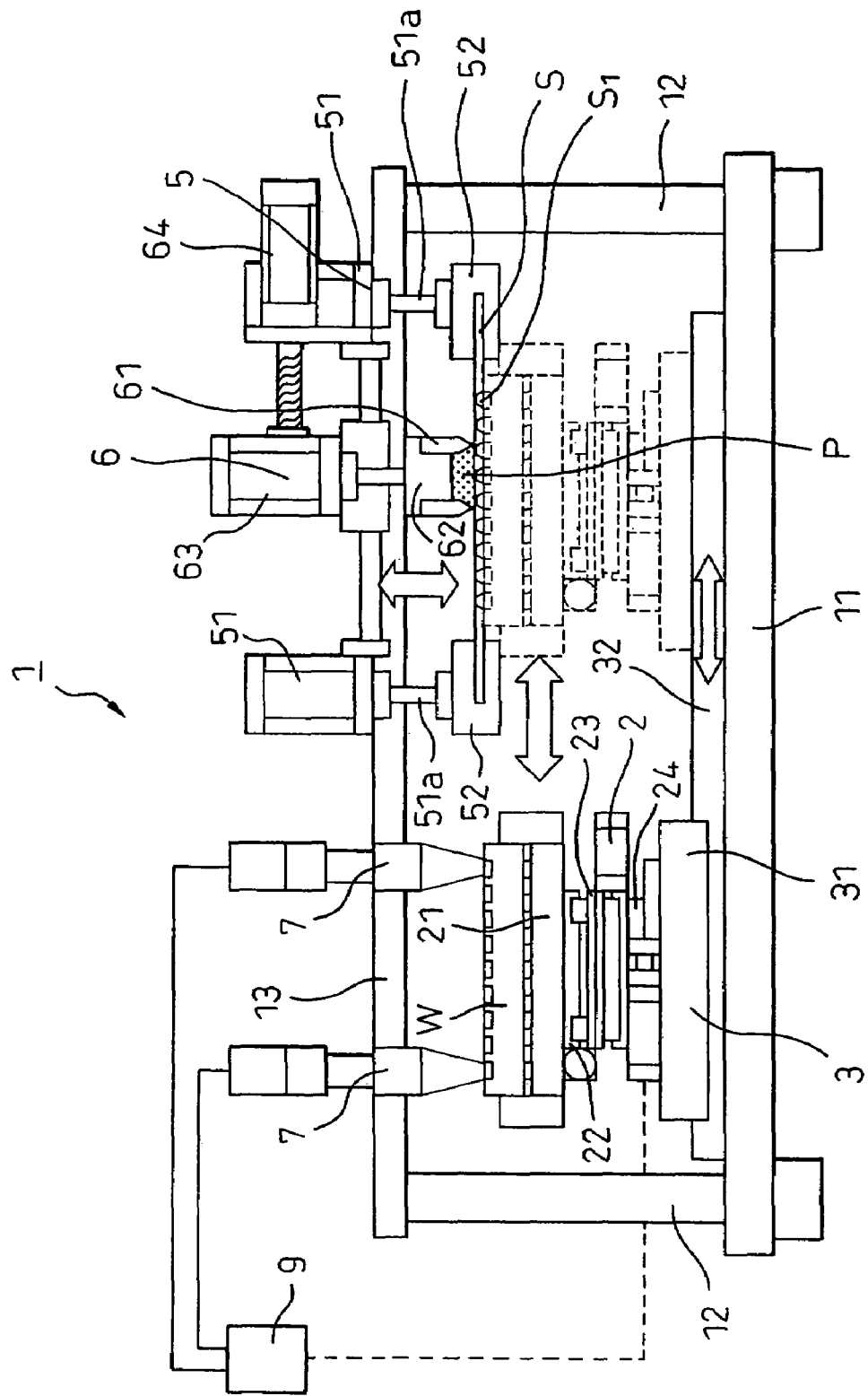
FIG. 1 is a view showing an overall construction of a screen printing apparatus according to an embodiment of the invention.
Figure 2:
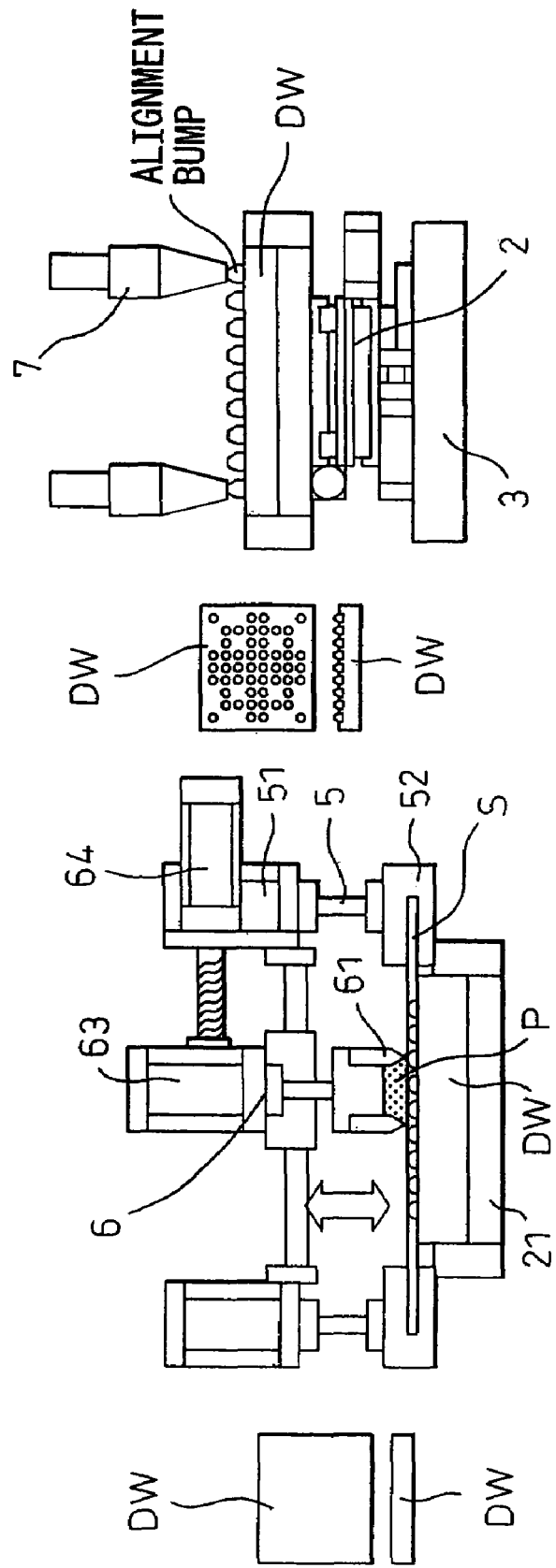
FIGS. 2A and 2B are explanatory views for explaining the operation (printing method) of the screen printing apparatus according to the invention, wherein FIG. 2A explains printing of solder paste to a dummy work and FIG. 2B explains an image processing of the dummy work after printing.
Figure 3:
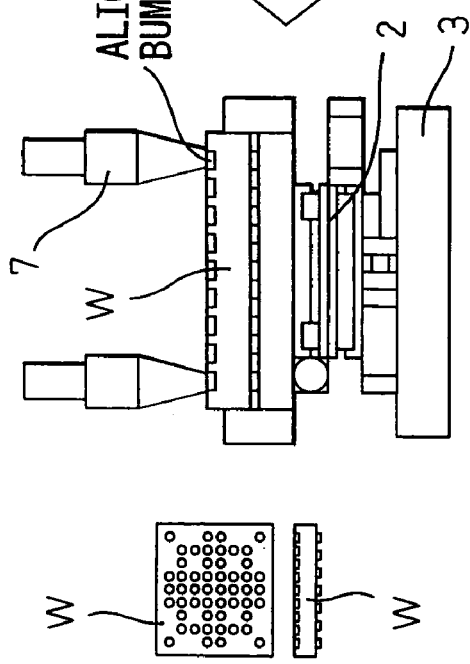
FIGS. 3A and 3B are explanatory views for explaining the operation (printing method) of the screen printing apparatus according to the invention in the same way as in FIG. 2, wherein FIG. 3A explains positioning of a work and FIG. 3B explains printing of the solder paste to the work.
Figure 4:
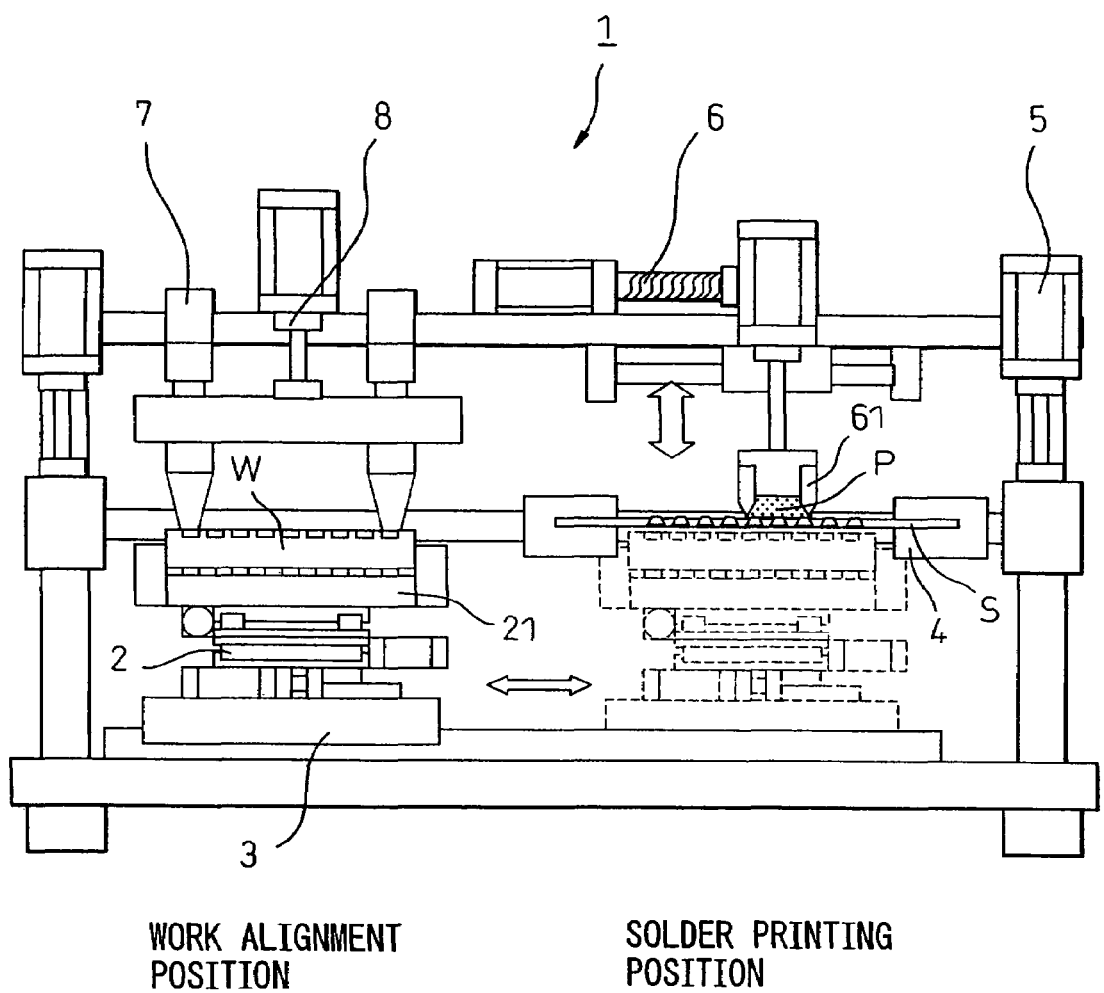
FIG. 4 is a view showing an overall construction of a screen printing apparatus according to the prior art.

A screen printing method and its printing apparatus according to embodiments of the invention will be hereinafter explained with reference to the accompanying drawings. FIG. 1 is a view showing an overall construction of a screen printing apparatus according to the embodiment of the invention. The screen printing apparatus 1 basically includes a work alignment mechanism 2 for positioning a work W as a substrate put on a table 21 in X, Y, θ directions, a work movement mechanism 3 for linearly moving the work W between a work alignment position and a printing position, a screen elevation mechanism 5 for moving up and down a screen (screen mask) S, a printing mechanism 6 for printing a solder paste P on the work W at the printing position through the screen S, an image processing camera 7 for imaging the work W as well as the screen S, and a control unit 9 for storing the images taken by the camera 7 and controlling the work alignment mechanism 2 on the basis of the images.

The work alignment mechanism 2 includes the table 21 for supporting and holding the work W, an X direction movement table 22 moving in an X direction, a Y direction movement table 23 moving in a Y direction and a rotary table 24 rotating in a θ direction. All these members are combined with one another and are fitted onto a conveyor table 31 of the work movement mechanism 3. The upper surface of the table 21 is an adsorption surface having a large number of suction ports (not shown) and can adsorb and position the work W while the work W is put on the conveyor table 31. These suction ports are connected to a vacuum pump, not shown in the drawings. The table 21 is supported on the X direction movement table 22 and this X direction movement table 22 is supported on the Y direction movement table 23. Furthermore, the Y direction movement table 23 is supported on the rotary table 24. Therefore, the position of the work W on the table 21 can be corrected in the X, Y and θ directions. The movement in the X and Y directions and the rotation in the θ direction are made by servo motors 25, respectively.

The work movement mechanism 3 includes a conveyor guide 32 that is disposed on a base 11 of the printing apparatus 1 and a conveyor table 31 that moves along the conveyor guide 32 while supporting thereon the work alignment mechanism 2. The conveyor 31 is allowed to linearly reciprocate between the work alignment position and the printing position along the conveyor guide 32 by a driving unit, not shown in the drawings.

The term "screen S (screen mask)" is a concept that includes those having a predetermined pattern on the surface of a mask such as a metal mask and a screen mask in a narrow sense of the word. A pattern by printing ports $S_1$ is formed on the screen S but a positioning marker is not formed. This screen S is supported by the screen elevation mechanism 5 and is allowed to move up and down at the printing position. The invention does not include a screen movement mechanism for moving the screen between the printing position and the work alignment position, and the screen S cannot move between them.

The screen elevation mechanism 5 includes a pair of elevation cylinders 51 fitted to a transverse mount member 13 bridged between right and left columnar members and elevation members 52 implanted to the base 11 of the printing apparatus 1 and a holder 52 for holding the screen that is fixed to one of the ends of a piston 51a sliding inside the elevation cylinder 51. The holder 51 is operated by a fluid introduced into the elevation cylinder 51, for example.

The printing mechanism 6 and the image processing camera 7 are fitted to the transverse mount member 13 of the printing apparatus 1 outside the screen elevation mechanism 5 described above. In other words, the pair of image processing cameras 7 are fitted and fixed to the transverse mount member 13 at the work alignment position. The image processing cameras 7 are fixed while their focus is set to the surface of the work W. A control unit 9 for storing the images from the cameras 7 and correcting the table 21 of the work W in the X, Y and θ directions on the basis of the image recognition information so stored is connected to the image processing cameras 7.

The printing mechanism 6 includes a squeegee head 62 which is fitted to the transverse mount member 13 of the printing apparatus and to which a squeegee 61 is fitted, a squeegee elevation mechanism 63 for moving up and down the squeegee head 62 and a squeegee movement mechanism 64 for transversely moving the squeegee head 62. The squeegee elevation mechanism 63 is constituted by a piston-cylinder mechanism, for example, and the squeegee movement mechanism 64 is constituted by a ball screw mechanism, for example. Therefore, the squeegee movement mechanism 63 moves the squeegee 61 of the squeegee head 62 down to a position at which the squeegee 61 comes into contact with the screen S and then the squeegee movement mechanism 64 moves the squeegee 61 on the screen S in such a fashion that the screen S is brought into contact with the work W by the squeegee movement mechanism 64. The solder paste P on the screen S is pushed by the squeegee 61 and is applied to the work W through the printing ports Si of the screen S, and screen printing is thereby executed.

The operation (screen printing method) of the screen printing apparatus 1 of this embodiment having the construction described above will be explained with reference to FIGS. 2A to 3B.

First, a dummy work DW having the same outer shape as that of the work W is put on and supported by the table 21 of the work alignment mechanism 2. The work movement mechanism 3 is operated and the work alignment mechanism 2 holding the dummy work DW is moved from the work alignment position to the printing position while the work alignment mechanism 2 is not operated (kept stationary). Under this condition, the solder bumps are printed to the dummy work DW by the ordinary printing operation as shown in FIG. 2A. In other words, the screen S is moved down by the screen elevation mechanism 5 and is brought into contact with the dummy work DW. Next, the squeegee head 62 is moved down by the squeegee elevation mechanism 63 of the printing mechanism 6 and the squeegee 61 is brought into contact with the screen S. The squeegee 61 is moved on the screen S by the squeegee movement mechanism 64 under this condition and the solder paste P on the screen S is pushed by the squeegee 61 and is applied to the dummy work DW through the printing ports S1 of the screen S. The solder bumps are printed in this way onto the dummy work DW. After printing, the screen S and the squeeze head 62 are allowed to move up and return to their original positions.

Next, the work alignment mechanism 2 supporting and holding the printed dummy work DW is returned from the printing position to the work alignment position. The image processing cameras 7 fixed as shown in FIG. 2B take the image of the dummy work DW to which the solder bumps are printed at the work alignment position and the control unit 9 stores the images of coordinates of two positions $(x_1, y_1, \theta_1)$ of the solder bumps (characteristic solder bumps of the outermost periphery, for example) specified for alignment from the images. The reference positions of the solder bumps are stored in the control unit 9 through the screen alignment operation described above.

Printing of the solder bumps to the work W after storing the images is made by fundamentally the same operation as shown in FIGS. 3A and 3B. In other words, the printed dummy work DW at the work alignment position is taken out from the table 21 and the work W to be next printed is put on and held by the table 21. Next, as shown in FIG. 3A, the image processing cameras 7 take the image of the work W and the solder bump mount positions corresponding to the solder bumps of the dummy work DW specified for alignment from the images and information of the position coordinates $(x_2, y_2, \theta_2)$ is inputted to the control unit 9. The control unit 9 compares the position coordinates $(x_1, y_1, \theta_1)$ of the solder bumps specified for alignment of the printed dummy work W with the position coordinates $(x_2, y_2, \theta_2)$ of the solder bump mount positions specified for alignment of the corresponding work W and gives an instruction to the work alignment mechanism 2 to correct the position by the difference $(|x_1-x_2|, |y_1-y_2|, |\theta_1-\theta_2|)$. The work alignment mechanism 2 operates the X direction movement mechanism 22, the Y direction movement table 23 and the θ direction movement table 24 in accordance with this instruction and executes the position correction in the X, Y and θ directions. Positioning of the work W is made in this way on the basis of the position information of the solder bumps of the printed dummy work DW.

In the embodiment described above, the solder bump shape of the dummy work DW is different from the to-be-printed pattern at the solder bump mount position and the solder bump shape of the dummy work DW is round while the to-be-printed pattern is rectangular. The pattern of the printed portion superposes on the solder bump mount position after printing. Therefore, three kinds of storage images are arranged respectively and the position coordinates are acquired by switching them in accordance with each object. Owing to this switching function, position correction from the bump position after printing to the next position can be made.

Various means such as extraction of the outer shape and the outer peripheral edge are available depending on the processing algorithm of the image processing and high preciseness can be attained by suitably selecting them in accordance with the printing shape of the work and accuracy to be obtained.

The work W that is positioned is conveyed by the work conveying mechanism 3 from the work alignment position to the printing position. Next, as shown in FIG. 3B, printing is done on the work W in the same way as printing of the dummy work DW described above. In other words, the screen elevation mechanism 5 moves down the screen S to the position at which it comes into contact with the work W. Next, the squeegee elevation mechanism 63 moves down the squeegee head 62 and the squeegee 61 comes into contact with the screen S. Under this condition, the squeegee 61 is moved by the squeegee movement mechanism 64 on the screen S and the solder paste P on the screen P is pushed by the squeegee 61 and is applied to the work W through the printing ports $S_1$. After printing of the solder bumps on the entire surface of the work W is complete, the screen S and the squeegee head 62 move up and return to their original positions. The work W is returned from the printing position to the work alignment position and is taken out.

Printing of the work W is done as the steps shown in FIGS. 3A and 3B are repeated.

As explained above, the screen printing method according to the invention can achieve high precision positioning that has never before achieved by the prior art technologies by using the solder bumps on the work W as the positioning markers. To further improve accuracy, the repetition error can be minimized by sufficiently repeating the screen mask alignment operation by the dummy work DW and conducting a statistic processing of the center coordinates of the image data of the work W taken individually. The method of the invention can thus satisfy the future requirement for high accuracy.

Furthermore, the invention can employ the following embodiment.

In the explanation given above, the bump specified for alignment has been explained by using two bumps of the work wiring as the positioning markers but the bumps may be those which are separately arranged for alignment, too.

The explanation has been given on the assumption that the shape of the solder mount position of the work W is the same way as the bump shape to be printed but they may have different shapes and different sizes.

The explanation has also been made on the assumption that the image processing camera 7 is fixed at the height of the work W but the same effect can be obtained by using a mechanism moving up and down in accordance with the thickness of the work W provided that the camera 7 can be fixed under the same condition at the time of printing of the dummy work DW.

As explained above, the invention employs the following system.

(1) The invention employs the system that directly aligns the printing ports of the metal screen without using the positioning markers of the metal screen that may otherwise invite the production error, in order to accomplish high precision paste printing of the minute solder bumps.

(2) To directly align the printing ports by absorbing the movement errors, the invention employs the system that inputs the images of the position coordinates of the solder bumps after printing at the work printing position and uses them as the positioning coordinates.

(3) The invention employs the system that switches the images stored even when the pattern of the solder bump mount positions as the positioning objects is different from the images of the printed solder bumps (solder bumps printed by printing ports of screen) as the reference.

(4) The invention employs the system that selects the characteristic bump at the outermost position of the to-be-printed area (pattern) as the bump of the positioning object for each screen.

(5) The invention employs the system in which the outer shape of the dummy plate is the same as that of the work and the alignment mechanism is used also as the work positioning mechanism to minimize the mechanical errors.

(6) To prevent degradation of accuracy resulting from the changes of the installation environment (elongation due to temperature and due to degradation of screen, etc.) during printing, the invention employs the system that selects various image patterns (solder itself, shape of to-be-printed position, solder itself+shape of to-be-printed position) and uses them for positioning so as to statistically reflect the result of immediately preceding printing on the reference position of next printing.

(7) The invention employs a mechanical construction that minimizes the distance from the work alignment position to the solder printing position to the smallest distance by eliminating the camera movement mechanism and the screen movement mechanism and prevents the drop of accuracy in the repeated stop of the operation resulting from elongation of the setup.

(8) The invention employs the system free from the elevation error of the screen by employing the construction that supports the screen from the reference plate constituted by the solder printing mechanism.

Employing the systems described above, the invention can accomplish screen printing of the solder bumps that satisfies the requirements for further miniaturization, higher density and large number of connection points.

While the invention has been described by reference to specific embodiments chosen for purposes of illustration, it should be apparent that numerous modifications could be made thereto, by those skilled in the art, without departing from the basic concept and scope of the invention.

The invention claimed is:

1. A screen printing method for superposing a screen mask (S) having printed thereon a predetermined pattern on a work (W) to which a predetermined pattern is to be printed, and printing solder paste (P) onto said work through said screen mask, comprising:
   (1) a printing step of moving a dummy work (DW: a work for printing a reference necessary for subsequent printing) from a work alignment position to a printing position while said dummy work DW is fixed to a work alignment mechanism, and conducting solder printing to said dummy work;
   (2) a storing step of returning said dummy work after solder printing to the work alignment position and storing an image of position coordinates of a solder bump specified for alignment from the image of said solder-printed dummy work taken by stationary image processing cameras;
   (3) a positioning step of conducting positioning of said work at a next work alignment position via said work alignment mechanism on the basis of the image stored in said storing step; and
   (4) a printing step of moving said work from the next work alignment position to the printing position while said work is fixed to said work alignment mechanism, and conducting solder printing to said work.

2. A screen printing method according to claim 1, further comprising the steps of:
   repeating positioning of subsequent works on the basis of the image of position coordinates of said dummy work stored, conducting statistic processing of center coordinates of an image data of said works individually taken, and minimizing repetition errors.

* * * * *